United States Patent
Nakano et al.

(10) Patent No.: US 9,162,324 B2
(45) Date of Patent: Oct. 20, 2015

(54) SOLDER PASTE AND SOLDER JOINT

(75) Inventors: Kosuke Nakano, Kusatsu (JP); Hidekiyo Takaoka, Omihachiman (JP); Minoru Ueshima, Matsudo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 1829 days.

(21) Appl. No.: 12/084,793

(22) PCT Filed: Nov. 10, 2006

(86) PCT No.: PCT/JP2006/322441
§ 371 (c)(1),
(2), (4) Date: Aug. 4, 2009

(87) PCT Pub. No.: WO2007/055308
PCT Pub. Date: May 18, 2007

(65) Prior Publication Data
US 2009/0301607 A1 Dec. 10, 2009

(30) Foreign Application Priority Data

Nov. 11, 2005 (JP) .................. 2005-327727

(51) Int. Cl.
*B23K 35/362* (2006.01)
*B23K 35/26* (2006.01)
*B23K 35/02* (2006.01)
*B23K 35/30* (2006.01)
*H05K 3/34* (2006.01)

(52) U.S. Cl.
CPC ............. *B23K 35/264* (2013.01); *B23K 35/025* (2013.01); *B23K 35/0244* (2013.01); *B23K 35/26* (2013.01); *B23K 35/262* (2013.01); *B23K 35/302* (2013.01); *B23K 35/362* (2013.01); *H05K 3/3484* (2013.01); *H05K 2201/0272* (2013.01)

(58) Field of Classification Search
CPC ..................................... B23K 35/0244
USPC .......................................... 148/24
See application file for complete search history.

(56) References Cited

U.S. PATENT DOCUMENTS

| | | | | |
|---|---|---|---|---|
| 5,368,814 A * | 11/1994 | Gonya et al. | .................. | 420/587 |
| 5,429,292 A * | 7/1995 | Melton et al. | ............ | 228/180.22 |
| 5,853,622 A * | 12/1998 | Gallagher et al. | ............ | 252/512 |
| 6,884,278 B2 * | 4/2005 | Shimizu et al. | .................. | 75/255 |
| 2002/0012608 A1 | 1/2002 | Takaoka et al. | ............... | 420/561 |
| 2004/0170524 A1 * | 9/2004 | Lambracht et al. | ........... | 420/577 |

FOREIGN PATENT DOCUMENTS

JP 62197292 8/1987
JP 04022595 1/1992

(Continued)

*Primary Examiner* — Jessee Roe
*Assistant Examiner* — Christopher Kessler
(74) *Attorney, Agent, or Firm* — Michael Tobias

(57) ABSTRACT

The invention provides a solder paste which has a solidus temperature of 255° C. or above and is improved in the wettability between Bi and Cu or Ag electrode to attain approximately equivalent wettability to those of Pb-containing high-temperature solders even in low-temperature soldering. The solder paste comprises a metal powder component consisting of Bi or a Bi alloy, a solidus temperature lowering metal for Bi, and a solid-phase metal capable of forming an intermetallic compound with the solidus temperature lowering metal, and a flux component.

12 Claims, 1 Drawing Sheet

(56) References Cited

FOREIGN PATENT DOCUMENTS

| | | | |
|---|---|---|---|
| JP | 11320177 A | * | 11/1999 |
| JP | 11347784 | | 12/1999 |
| JP | 2001205477 | | 7/2001 |
| JP | 2001353590 | | 12/2001 |
| JP | 2003211289 | | 7/2003 |
| JP | 2005072173 | | 3/2005 |
| JP | 2005288529 | | 10/2005 |
| WO | WO 02099146 A1 | * | 12/2002 |
| WO | WO 03026828 A2 | * | 4/2003 |

* cited by examiner

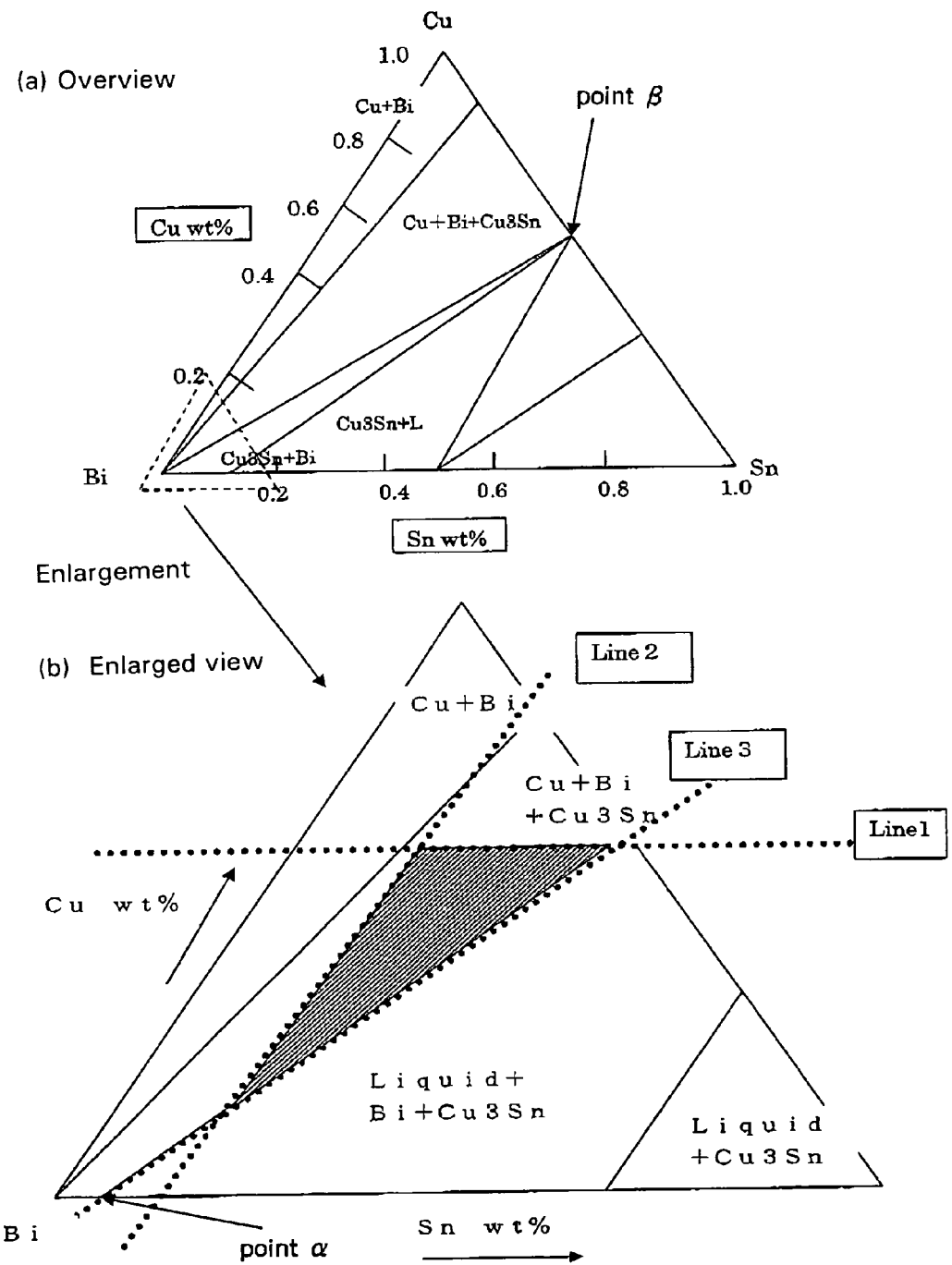

SOLDER PASTE AND SOLDER JOINT

TECHNICAL FIELD

The present invention relates to a solder paste, and specifically to a solder paste for use in reflow soldering and to a solder joint. More specifically, the present invention relates to a solder paste for use in reflow soldering to form a solder joint comprised of a lead-free solder and to a solder joint obtained using the solder paste.

BACKGROUND ART

For the sake of convenience, the present invention will be explained while distinguishing between high-temperature solder and ordinary solder. High-temperature solder collectively refers to solder having a melting point higher than that of ordinary solder. In this specification, a high-temperature solder means a lead-free, high-temperature solder having a solidus temperature of 255° C. or higher.

A high-temperature solder can be used in the same manner as an ordinary solder, but high-temperature solder is used in applications in which the resulting solder joints are exposed to high temperatures such as those to which electrodes of power transistor equipment are exposed. High-temperature solders can also be used in other applications. Namely, in soldering of electronic equipment, there are cases in which soldering (first soldering) is applied to an intended member, and then additional soldering (second soldering) is applied to the neighborhood of the previously-soldered member. When the second soldering is carried out, the first-prepared solder joint must not be melted. Therefore, a high-temperature solder having a high melting point is used in the first soldering.

Conventional high-temperature solders are Pb-based solders such as Pb-5Sn (solidus temperature: 300° C., liquidus temperature: 314° C.), Pb-10Sn (solidus temperature: 268° C., liquidus temperature: 301° C.), and Pb-2.5Ag (solidus temperature: 304° C., liquidus temperature: 304° C.). These Pb-based, high-temperature solders can exhibit improved solderability with respect to electrodes made of Cu, Ag, and the like. Recently, however, the use of Pb-based solder is being restricted due to pollution problems caused by Pb. At present, lead-free, high-temperature solder is under development, but an Sn-based, lead-free solder which has both solidus and liquidus temperatures high enough to be suitable for a high-temperature solder has not yet been proposed.

Typical lead-free solders at present, such as Sn—Ag—Cu alloys (Sn-3Ag-0.5Cu), are used to carry out soldering of electronic parts to a circuit board and the like at a temperature of about 240° C. When electronic parts are mounted on a circuit board and the like and the electronic parts have been soldered using a lead-free, high-temperature solder, it is necessary for the high-temperature solder to have a solidus temperature of 255° C. or higher from a practical viewpoint, since the resulting solder joints must not be melted during mounting (packaging) carried out by the second soldering. In the past, a high-temperature solder which is in a half-melted state at a temperature of about 255° C. was proposed. This was because there was no high-temperature solder which could be substituted for conventional Pb-containing high-temperature solders, so there was no choice except to use a solder alloy which is not completely melted at a temperature of 255° C.

Bi-based alloys such as Bi—Ag, Bi—Cu, and Bi—Sb are known as alloys which have a solidus temperature of 255° C. or higher (Patent Documents 1-3). However, these solder alloys do not react with an electrode made of Cu, Ag, etc., to which soldering must be applied, and it is difficult to obtain a satisfactory solder joint. In order to promote reaction of a solder alloy with an electrode made of Cu, Ag, etc., the addition of Sn, In and the like is effective, since Sn and In form an intermetallic compound with the metal of which the electrode is made. However, this method has the disadvantage that mere addition of these elements, i.e., the addition of 0.2 mass % or more of Sn or of a minute amount of In would result in a composition having a solidus temperature of 139° C. or 109.5° C., respectively, which is lower than 255° C.

Patent Document 1: JP 2001-205477 A1
Patent Document 2: JP 2005-72173 A1
Patent Document 3: JP-2001-353590 A1

DISCLOSURE OF INVENTION

Problems to be Solved by the Invention

The object of the present invention is to provide a solder paste which has a solidus temperature of 255° C. or higher, which exhibits improved wettability with respect to typical items for soldering, such as Cu or Ag electrodes, and which is able to achieve wettability close to that achieved by conventional Pb-containing, high-temperature solders even when low-temperature soldering is carried out.

Means for Solving the Problems

The inventors of the present invention investigated Bi and Bi alloys with the aim of achieving the object described above and found the following:

(i) A Bi or Bi-alloy high-temperature solder having a satisfactory level of wettability can be obtained by incorporating metal powders into a solder paste. Each metal powder constitutes an alloying element of the resulting solder alloy and is classified by function as an element for reducing the solidus temperature or as an element for ensuring the solidus temperature.

(ii) When the proportion of an element for reducing the solidus temperature of Bi or a Bi alloy is restricted to a certain level, the element can work effectively to improve wettability.

(iii) The addition of the element(s) described above inevitably brings about a reduction in the solidus temperature on account of its proportion with respect to the alloy as a whole after melting, although the wettability can be improved as mentioned above. Thus, if a third metal element which can serve as a component which maintains a solid state at a soldering temperature is added, the reduction in the solidus temperature can be avoided.

(iv) When at least a portion of the third metal element is present in the form of a powder and the second and third metal elements are chosen so as to form an intermetallic compound between them, the formation of an intermetallic compound is promoted to effectively ensure a high solidus temperature required for a high-temperature solder.

The present invention, in its broadest sense, is a solder paste characterized in that the paste is a mixture comprising three types of metal powder components and a flux component. Among the three metal powder components, at least one of them comprises Bi or a Bi alloy having a solidus temperature of 255° C. or higher, and the remainder are two types of metal components comprising an element for reducing the solidus temperature and an element for ensuring the solidus temperature, respectively.

The present invention is a solder paste comprising a metal powder component mixed with a flux component, characterized in that the metal powder component consists of a first metal, a second metal, and a third metal with at least a portion of the third metal being in the form of a powder of the third metal, the first metal is selected from at least one of Bi and Bi alloys, the second metal has a function of reducing the solidus temperature of the first metal and forming an intermetallic compound with the third metal, and the metal powder component contains 0.7-6 mass % of the second metal, 1.3-10 mass % of the third metal, and a balance of the first metal with respect to 100 mass % of the metal powder component.

According to the present invention, when the second metal is combined with the first metal, soldering at a relatively low temperature, such as 255° C., can be achieved. Due to the addition of the second metal, it is possible to improve wettability with respect to a Cu or Ag electrode so that soldering with wettability close to that for conventional Pb-containing, high-temperature solders can be achieved. Furthermore, since the second metal having a low melting point is combined with the third metal to form an intermetallic compound having a high melting point, the resulting solder joint has a solidus temperature of 255° C. or higher, and the first formed solder joint does not melt when second soldering is carried out using a usual Pb-free solder.

BRIEF DESCRIPTION OF THE DRAWINGS

FIG. 1 (a) and FIG. 1 (b) are Bi—Sn—Cu ternary alloy constitution diagrams in which the ranges of the present invention are indicated.

BEST MODE FOR CARRYING OUT THE INVENTION

Embodiments of the present invention will be explained. The above-mentioned three types of metals have the following properties. For ease of explanation, Bi or a Bi alloy, a solidus temperature-reducing metal for Bi, and a solidus temperature-ensuring metal will be referred to as the first, second and third metals, respectively. Unless otherwise indicated, "%" with respect to proportions in the composition in the present specification means "mass %" of each metal with respect to the total amount of the metal component. In addition, unless otherwise indicated, the word "metal" in the present invention encompasses alloys within its meaning.

The First Metal:

The first metal is Bi or a Bi alloy having a solidus temperature of 255° C. or higher. After soldering, this metal constitutes a major portion of the resulting solder joints.

Examples of the first metal are Bi and Bi alloys having a solidus temperature of 255° C. or higher. These Bi alloys include alloys such as Bi—Ag, Bi—Cu, Bi—Sb, Bi—Ni, Bi—Co, Bi—Mg, Bi—Pd, Bi—Rh, Bi—Si, and Bi—Te.

The amount of the first metal is the balance when the second and third metals, which will be explained below, are combined with the first metal to make 100% of the metal powder component. Usually, the amount of the first metal is 84-98.1%.

The Second Metal:

The second metal is a metal which reduces the solidus temperature of the first metal when added to the first metal and which forms an intermetallic compound with the third metal (e.g. Ag, Cu etc.), which will be explained later.

The second metal is a metal which improves the wettability of the first metal with respect to the Ag or Cu constituting electrodes. Examples of the second metal are Sn, In, and alloys containing these metal elements. The purpose of addition of the second metal is to improve the wettability of the first metal with respect to electrodes. It is therefore desirable for a major portion of the second metal and its alloys to melt before the first metal begins to melt. Examples of alloys of the second metal include alloys such as Sn—In, Sn—Ag, Sn—Cu, Sn—Ag—Cu, Sn—Ag—Cu—In, Sn—Bi, Sn—Co, Sn—Ni, Sn—Sb, and Sn—Au.

At least a part of the second metal may previously be alloyed with the first metal. For example, the first and second metals may be in the form of a Bi—Sn or Bi—In alloy.

According to the present invention, the amount of the second metal as a constituent of the powder component is defined as follows. The lower limit is defined as 0.7% so as to improve wettability. The upper limit is defined as 6% so that substantially all of the second metal can be formed into an intermetallic compound with the third metal when the amount of the third metal in the form of a powder falls within the range of the present invention. This is because the solidus temperature of a solder joint would become lower than 255° C. and a lower melting point component of the solder would flow out at the time of the second soldering if the second metal remained without forming an intermetallic compound with the third metal.

The second metal is preferably added in an amount of 1% or more, and the upper limit thereof is 6%. A more preferable range for the second metal is 3-5%.

When the first and the second metals are alloyed with each other, the total amount of the first and second metals is taken as the amount of the first and second metals.

The second metal, i.e., Sn, In, and alloys containing either of them, has satisfactory wettability with respect to Ag or Cu constituting an electrode to be soldered. When the amount thereof is less than 0.7%, however, an improvement in wettability cannot be expected.

The Third Metal:

The third metal is a metal which forms an intermetallic compound with the second metal at the time of soldering.

The third metal also is an elemental metal or alloy which partially or completely alloys a mixture of powders of each of the first, second, and third metals and results in a solder joint having a solidus temperature of 255° C. or higher.

Namely, a portion of the third metal is always in a solid state at the time of soldering. For this reason, when the amount of the third metal is excessive, flowing of molten solder is prevented, and a self-alignment effect and fillet-forming effect are reduced.

Examples of the third metal are Cu. Ag, Sb, Ni, Fe, Co, Pd, Pt, Ti, Cu—Ag alloys, and Cu—Sb alloys. The third metal may be alloyed with the first metal. In such a case, at least a portion of the third metal is incorporated into the metal powder component in the form of a powder of the third metal so as to be able to form an intermetallic compound with the second metal.

The surface of the third metal may be coated with a film of a metal selected from Ag, Au, and Sn having a thickness of 0.02-2 μm. This is because the cost of elemental Ag and Au is high compared with that of Cu. By using Cu as a base material and covering it with Ag or Au, material costs can be reduced while accelerating formation of intermetallic compounds with the second metal. In addition, when the third metal is previously covered with Sn, formation of an intermetallic compound with the second metal is accelerated markedly.

When the amount of the third metal of the metal powder component is higher than 10%, the fluidity of the solder is impaired. On the other hand, since the solidus temperature must be 255° C. or higher for a solder joint in which the first, second and third metals are completely alloyed, the amount of the third metal in the form of powder is made 1.3% or more. Thus, the third metal is added in an amount of 1.3-10%.

Thus, the third metal is a metal which forms an intermetallic compound with the second metal at the time of first soldering. The amount thereof is adjusted so that a solder joint in which all of the first, second, and third metals are alloyed with each other has a solidus temperature of 255° C. or higher.

When the second metal is Sn or In, the following metals are effective as the third metal.

When the second metal is Sn, examples of the third metal are Ag, Cu, Ni, Fe, Co, Pd, Pt, Ti etc., which form an intermetallic compound with Sn. Of these metals, Ni also forms an intermetallic compound with the first metal, but its speed of formation of an intermetalllic compound with Sn is faster, so a component which flows at the time of second soldering does not remain.

When the second metal is In, examples of the third metal are Ag, Cu, Sb, Ni, Pd, Pt, etc., which form an intermetallic compound with In. Of these metals, Ni also forms an intermetallic compound with the first metal, but its speed of formation of an intermetallic compound with In is faster, so a component which flows at the time of second soldering does not remain.

An additive to the first metal is preferably added in an amount sufficient to give a liquidus temperature of 280° C. or less for an alloy resulting from soldering. However, in some cases in which the soldering temperature is higher than 320° C., a solder alloy having a liquidus temperature of 320° C. or less can be used if the alloy does not cause any troubles.

Soldering carried out using a solder paste of the present invention is a process in which soldering proceeds while keeping the third metal in a solid state. When a solid phase remains at the soldering temperature, the proportion of a solid phase and a solid phase metal, i.e., the third metal is 10% or less with respect to the total amount of the metal powder component.

A solder paste of the present invention, which is obtained by admixing the above-mentioned metal/alloy powder with a fluxing agent, can exhibit improved spreadability and self-alignment effects in reflow soldering. In addition, a solder fillet having a normal shape can be obtained. Since an alloy constituting the solder joint after soldering has a solidus temperature of 255° C. or higher, second soldering can be carried out without problems even using a Pb-free solder alloy, which is widely used at present.

In summary, typical combinations of each of the powders for the first, second and third metals are as follows. However, these are mere examples, and it is possible for the present invention to be carried out in the form of other embodiments within the scope of the present invention.

(i) A powdery mixture of powders of each of the first metal, the second metal and the third metal.

(ii) A mixture of a powder of an alloy of the first metal and the second metal, and a powder of the third metal.

(iii) A mixture of a powder of an alloy of the first metal and the second metal, a powder of the second metal, and a powder of the third metal.

(iv) A mixture of a powder of an alloy of the first metal and the third metal, a powder of the second metal, and a powder of the third metal.

A combination of the first, second, and third metals and their ranges can be determined as follows for an Sn—Cu—Bi alloy as a typical example.

FIG. 1(a) is an isothermal cross section of a diagram of an Sn—Cu—Bi alloy. FIG. 1(b) is an enlargement of a corner area at the bottom left (the triangular area surrounded by a dashed line) of the isothermal cross section. The ranges for the first, second, and third metals correspond to the hatched area of FIG. 1(b). The hatched area is an area surrounded by below-defined Lines 1, 2, and 3. Line 1 is a line at which the content of Cu is 10 wt % (mass %), and Line 2 is a line at which the content of Sn is 0.7 wt % (mass %). Line 3 is a borderline between an area where Bi and $Cu_3Sn$ can co-exist at 255° C. and an area where a liquid phase and $Cu_3Sn$ can coexist. Specifically, this is the line connecting point β of FIG. 1(a) and point α of FIG. 1(b).

Specific values for point β and point α for a variety of combinations in which the first metal is Bi, the second metal is Sn or In, and the third metal is Cu, Ag, or Sb are shown in Table 1.

The combinations shown in Table 1 can be described in another way as shown in Table 2, in which particularly practical examples among a variety of combinations of the present invention are shown.

TABLE 1

|  | First Metal | Second Metal | Third Metal | Point α | Point β |
|---|---|---|---|---|---|
| Mixture of three types of metal powder | Bi | Sn | Cu | (99.5, 0.5, 0) | (0, 38, 62) |
|  |  | Sn | Ag | (99.7, 0.3, 0) | (0, 23, 77) |
|  |  | In | Cu | (99.7, 0, 0.3) | (0, 43, 57) |
|  |  | In | Ag | (99.7, 0, 0.3) | (0, 23, 77) |
|  |  | In | Sb | (96, 0, 4) | (0, 48, 52) |

Point α and point β indicate the composition of the mixture.

TABLE 2

Combinations of metal powders

|  | First Metal | Second Metal | Third Metal | Intermetallic compound between the second and the third metal (including an alloying element contained in the first metal) |
|---|---|---|---|---|
| Mixture of three types of metal powders | Bi | Sn | Ag,Cu,Cu—Ag,Cu—Sb | $Ag_3Sn,Cu_6Sn_5,Cu_3Sn$ |
|  | Bi—Ag | In | Ag,Cu,Sb,Cu—Ag,Cu—Sb | $AgIn_2,Ag_2In,Cu_3In_2$ |
|  | Bi—Cu | Sn—Bi | Ag,Cu,Cu—Ag,Cu—Sb | $Ag_3Sn,Cu_6Sn_5,Cu_3Sn$ |
|  | Bi—Sb | In—Bi | Ag,Cu,Sb,Cu—Ag,Cu—Sb | $AgIn_2,Ag_2In,Cu_3In_2$ |
| Mixture of two types of metal powders (The first metal and the second metal were pre-alloyed) | Bi—Sn |  | Ag,Cu,Cu—Ag,Cu—Sb | $Ag_3Sn,Cu_6Sn_5,Cu_3Sn$ |
|  | Bi—In |  | Ag,Cu,Sb,Cu—Ag,Cu—Sb | $AgIn_2,Ag_2In,Cu_3In_2$ |

The alloy compositions shown in the tables are within a range in which the alloy is in a solid state and the second metal and the third metal form an intermetallic compound in an isothermal cross section of the ternary alloy diagram of the first, second, and third metals at 255° C.

FIGS. 1(a) and (b) show specific compositions of a Bi—Cu—Sn system alloy in its isothermal cross section at 255° C. According to these diagrams, the contents of the elements are Bi: 84-98.1%, Sn: 0.7-6%, and Cu: 1.3-10%.

Metal powders employed in the present invention can be manufactured by a suitable means, such as atomizing, centrifugal pulverizing, etc., or a suitable mechanical means. The particle size thereof can be that used in well-known solder paste, e.g., 1-100 µm as an average particle diameter. An average particle diameter of 5 µm or larger is preferable for the powder of the third metal. This is because when the average particle diameter is less than 5 µm, the third metal and the second metal immediately form an intermetallic compound at the time of soldering and prevent the first metal and the third metal from fusing together, resulting in a drastic decrease in fusion properties and wettability.

When the number of particles of each of the first, second, and third metal powders are indicated as $N_1$, $N_2$, and $N_3$, respectively, a solder paste which can satisfy both of equations (1) and (2) is desirable.

$$0.1 < N_3/N_1 < 1.5 \quad (1)$$

$$0.1 < N_2/N_1 \quad (2)$$

When the number of particles of either of the second and third metals is less than 0.1 times the number of particles of the first metal, the number of particles of the second and third metals in a solder paste applied to some electrodes becomes too small, resulting in a variation in the number of particles of the second or third metal among electrodes, and there is a possibility of occurrence of variation in the composition of solder paste among electrodes.

When the number of particles of the third metal is 1.5 or more times the number of particles of the first metal, the third metal powder reacts with the first metal powder before formation of a low melting phase from the first metal powder and the second metal powder to prevent formation of the low melting phase from the first metal powder and the second metal powder, and there is a possibility of occurrence of undesirable soldering.

A flux component which can be employed in the present invention includes a flux based on a resin, an organic acid, an inorganic acid, etc., which can be selected depending on the purpose of the soldering. A preferred flux component is one used conventionally. In general, the flux may contain a rosin or resin, a solvent, an activator, and a thixotropic agent.

Examples of the rosin are a rosin and its derivatives. Examples of the solvent are ethylene glycol monobutyl ether, ethylene glycol monophenyl ether, etc. Examples of the activator are diphenylguanidine HBr, diethylamine HCl, etc. Examples of the thixotropic agent are hydrogenated castor oil, fatty amide, etc.

There is no limit on the ratio of the metal powder to the flux component. The ratio of the amount of the flux component to the total amount of the metal powder component and the flux component, i.e., the proportion of the flux component with respect to the amount of solder paste is 5-20% and usually 7-15%. The proportion may be the same as in conventional solder paste.

With the solder paste of the present invention, soldering can be performed at a temperature as low as 255-300° C., and when a solder joint is once formed, the resulting solder joint has a composition for so-called high-temperature solder having a solidus temperature of 255° C. or higher.

The mechanism of soldering to be carried out using a solder paste of the present invention will be explained taking reflow soldering as a concrete example.

For ease of understanding, reflow soldering will be explained for the case in which a solder paste of the present invention is used, the first, second, and third metals are each combined as an elemental metal powder and not in a pre-alloyed form to form a solder paste, and a high-temperature solder bond, i.e., a solder joint having a solidus temperature of 255° C. or higher is formed by heating the solder paste at a temperature of 255-300° C.

(1) When the solder paste is heated, the first metal and the second metal in the paste start melting at their respective melting points or at the melting point of an alloy of the first and second metals, i.e., at 130-255° C.

(2) When the second metal is melted and is present in a liquid phase, the second metal begins to wet a metal which constitutes an electrode, such as an Ag electrode or a Cu electrode and begins to form an intermetallic compound with the electrode.

(3) At the same time that the second metal wets the electrode-constituting metal, the second metal forms an intermetallic compound with the third metal.

(4) By further continuing heating, the second metal within a liquid phase is reacted with the third metal and the electrode to accelerate formation of intermetallic compounds. The first and the third metal have a solidus temperature of 255° C. or higher, and the second metal and the third metal together form an intermetallic compound having a solidus temperature of 255° C. or higher. Thus, the resulting solder joint has a solidus temperature of 255° C. or higher, and the solder joint does not melt at the time of second soldering.

One of the features of the present invention is that pre-alloying of the second metal and the third metal is not performed. The reason why pre-alloying is not performed and a mixture of different metal powders is instead used to formulate a solder paste is so that at the beginning of melting, a large amount of the second metal (Sn, In) will remain in a liquid phase. Namely, the second metal in a liquid phase can improve the wettability of the first metal itself. On the other hand, if the third metal powder and the second metal powder are pre-alloyed, the amount of the second metal in a liquid phase is decreased markedly and does not improve wettability at a temperature of 280° C. which is a usual soldering temperature for a Bi-based solder. Namely, if alloying is performed prior to formulation of the solder paste, there is no improvement in wettability. Thus, according to the present invention, the second and the third metals are not pre-alloyed with other in a solder paste, and wettability can be improved in the present invention.

The present invention will be described concretely in conjunction with working examples.

EXAMPLES

Table 3 shows examples of the first, second, and third metals together with combinations thereof in accordance with the present invention. An example in which two or more elements are indicated as being a metal powder, e.g., Bi-2.5Ag, means that the metal powder is comprised of an alloy of the two or more elements in the form of a powder. In addition, the note "resin included" means that the solder paste additionally contains a resin to increase strength. The note "Ag-coated Cu" means that the surface of the third metal, which is Cu in this case, is covered with a coating, which is an Ag coating in this case, having a thickness of 0.02-2 µm.

The average particle diameter of each of the particles shown in Table 3-1, Table 3-2, and Table 3-3 is 30 µm for the first metal, 20 µm for the second metal, and 15 µm for the third metal. Table 3-4 shows various combinations of proportions of these metals determined by $N_1$, $N_2$, and $N_3$, which were calculated from the average particle diameter of each of the metal powders and their proportions in the metal powder component.

Specimens of some of the examples in Tables 3-1, 3-2, and 3-3 were evaluated with respect to the properties indicated in the following (i)-(viii), and the results are shown in Table 4-1 and Table 4-2.

(i) Evaluation of Flowing Out of Solder:

A solder paste was applied to a thickness of 100 μm on Cu lands of a printed circuit board (dimensions of Cu lands: 0.7 mm×0.4 mm), and 1005-size chip-type ceramic capacitors were mounted on the resulting coated areas where a solder joint was to be formed. After carrying out reflow with a peak temperature of 280° C., the resulting printed circuit board was left to stand in an atmosphere having a relative humidity of 85% after it was sealed with an epoxy resin. The circuit board was then subjected to reflow heating with a peak temperature of 260° C. to determine the percent of defects in which the solder flowed out during heating. After soldering, the chip-type ceramic capacitors were removed from the printed circuit board to observe whether solder stains were found on the upper and lower surfaces thereof. The case in which stains were not found is marked "⊚" and the case in which stains were found is marked "X".

(ii) Evaluation of the Amount of Remaining Low-Melting Point Components (Evaluation of Reactivity):

A solder paste was applied to an alumina circuit board (dimensions: 10×6×0.6 mm thick) with a coating amount of 3×1×0.1 mm thick, and reflow was carried out with a peak temperature of 280° C. Approximately 7 mg of the reaction product were cut and subjected to DSC analysis in an $N_2$-containing atmosphere at a measurement temperature of 30-500° C. and a heating rate of 5° C./min using an $Al_2O_3$ reference. Based on the resulting DSC charts, the total of the adsorption heat content at peaks of heat adsorption of the molten metal at a temperature of 260° C. or lower was calculated so as to determine the amount of low-melting point components melted at a temperature of 260° C. The smaller the amount of the remaining low-melting point components, the greater the formation of intermetallic compounds. The case in which the amount of remaining low-melting point components, i.e., the amount of heat adsorption was zero is marked "⊚", the case in which the amount thereof was less than 1 mJ/mg is marked "O", and the case in which the amount thereof was 1 mJ/mg or more is marked "X".

(iii) Evaluation of Heat Resistance by a Heat Load Test:

A solder paste was applied to an oxygen-free copper plate (dimensions: 10×10×0.2 mm thick) with a coating amount of 3×1×0.1 mm thick, and after mounting a metal chip thereon, reflow was carried out with a peak temperature of 280° C. A weight of 100 g was suspended from a hole provided in the metal chip, and the chip was let stand in an oven maintained at a temperature of 260° C. The case in which the metal chip could bond to the board after 5 minutes (300 seconds) is marked "⊚". The case in which the metal chip fell in 5 minutes is marked "X". Numerical values in the tables indicate the interval of time in seconds before falling.

(iv) Bonding Strength (Lateral Direction Strength):

A solder paste was applied to a thickness of 100 μm on Cu-lands of a printed circuit board (dimensions of Cu lands: 0.7 mm×0.4 mm), and 1005-size chip-type ceramic capacitors were mounted on the resulting coated areas where a solder joint was to be formed. Reflow soldering with a peak temperature of 280° C. was carried out. The resulting bond was evaluated with respect to its lateral strength using a bonding tester. The lateral pushing rate was 0.05 mm·s$^{-1}$. Measurement was carried out at room temperature and at 260° C. The case in which the minimum strength was over 3N is marked "⊚", the case in which the minimum strength was 1N-3N is marked "O", and the case in which the minimum strength was less than 1N is marked "X". The numerical values shown in the tables indicate bonding strength (N).

(v) Formation of Solder Balls:

A solder paste was applied to a thickness of 100 μm on Cu lands of a printed circuit board (dimensions of Cu lands: 0.7 mm×0.4 mm), and 1005-size chip-type ceramic capacitors were mounted on the resulting coated areas where a solder joint was to be formed. Reflow soldering with a peak temperature of 280° C. was carried out. The formation of solder balls was evaluated on the undersurface and side surface of the chip components. The case in which there was no occurrence of solder balls is marked "⊚". The case in which there was occurrence of solder balls is marked "X". The numeric values shown in the tables indicate the percent occurrence of solder balls.

(vi) Formation of Voids:

A solder paste was applied to an oxygen-free copper plate (dimensions: 10×10×0.2 mm thick) with a coating amount of 3×1×0.1 mm thick, and after mounting metal chips thereon, reflow was carried out with a peak temperature of 280° C. A cross section of the resulting bonded area was observed to determine the percent occurrence of voids. The case in which the percent occurrence of voids was 0% is marked "⊚". The case in which the percent occurrence of void was 0-10% is marked "O". The case in which the percent occurrence of voids was over 10% is marked "X". The numeral values shown in the tables indicate the percent occurrence of voids.

(vii) Evaluation of Self-alignment:

A solder paste was applied with a thickness of 100 μm to a printed circuit board (dimensions of Cu lands: 0.7 mm×0.4 mm), and 1005-size chip-type ceramic capacitors were mounted on the resulting coated areas with an inclination of 15 degrees with respect to the regular position. Reflow soldering with a peak temperature of 280° C. was carried out. After soldering, the ratio of the ceramic capacitor chips which returned to their regular positions was determined. The case in which the ratio was over 80% is marked "⊚". The case in which the ratio was 70-80% is marked "O". The case in which the ratio was less than 70% is marked "X". The numeral values shown in the tables indicate the proportion of joints which returned to their regular positions.

(viii) Evaluation of Wettability of Solder Paste:

A solder paste was applied with a thickness of 150 μm to Cu lands of a printed circuit board (dimensions of Cu lands: 3.2 mm×4.0 mm). Reflow soldering with a peak temperature of 280° C. was carried out. After reflow, the surface areas of the Cu lands covered with a solder layer was determined. The case in which the covering area was over 70% is marked "⊚". The case in which the covering area was less than 70% is marked "X".

TABLE 3-1

| No. | | First metal powder | Second metal powder | Third metal powder | First metal powder | Second metal powder | Third metal powder | Composition of soldered joint | Solidus Temp. (° C.) | Liquidus Temp. (° C.) |
|---|---|---|---|---|---|---|---|---|---|---|
| Present Invention | 1 | Bi | Sn | Ag | 94 | 1 | 5 | Bi—1Sn—5Ag | 262 | 355 |
| | 2 | Bi | Sn | Ag | 93.5 | 1.5 | 5 | Bi—1.5Sn—5Ag | 257 | 360 |
| | 3 | Bi | Sn | Ag | 92 | 1 | 7 | Bi—1Sn—7Ag | 263 | 387 |

TABLE 3-1-continued

| No. | Powder First metal powder | Powder Second metal powder | Powder Third metal powder | Powder Composition (%) First metal powder | Powder Composition (%) Second metal powder | Powder Composition (%) Third metal powder | Composition of soldered joint | Solidus Temp. (° C.) | Liquidus Temp. (° C.) |
|---|---|---|---|---|---|---|---|---|---|
| 4 | Bi | Sn | Ag | 91 | 2 | 7 | Bi—2Sn—7Ag | 257 | 395 |
| 5 | Bi | Sn | Ag | 89 | 1 | 10 | Bi—1Sn—10Ag | 263 | 410 |
| 6 | Bi | Sn | Ag | 88 | 2 | 10 | Bi—2Sn—10Ag | 260 | 420 |
| 7 | Bi | Sn | Ag | 87 | 3 | 10 | Bi—3Sn—10Ag | 257 | 428 |
| 8 | Bi | Sn | Cu | 98 | 1 | 1 | Bi—1Sn—1Cu | 260 | 455 |
| 9 | Bi | Sn | Cu | 96 | 1 | 3 | Bi—1Sn—3Cu | 270 | 490 |
| 10 | Bi | Sn | Cu | 95.5 | 1.5 | 3 | Bi—1.5Sn—3Cu | 270 | >500 |
| 11 | Bi | Sn | Cu | 95 | 2 | 3 | Bi—2Sn—3Cu | 265 | >500 |
| 12 | Bi | Sn | Cu | 94 | 1 | 5 | Bi—1Sn—5Cu | 272 | >500 |
| 13 | Bi | Sn | Cu | 93 | 2 | 5 | Bi—2Sn—5Cu | 272 | >500 |
| 14 | Bi | Sn | Cu | 92 | 3 | 5 | Bi—3Sn—5Cu | 270 | >500 |
| 15 | Bi | Sn | Cu | 92 | 1 | 7 | Bi—1Sn—7Cu | 272 | >500 |
| 16 | Bi | Sn | Cu | 91 | 2 | 7 | Bi—2Sn—7Cu | 272 | >500 |
| 17 | Bi | Sn | Cu | 90 | 3 | 7 | Bi—3Sn—7Cu | 270 | >500 |
| 18 | Bi | Sn | Cu | 89 | 4 | 7 | Bi—4Sn—7Cu | 270 | >500 |
| 19 | Bi | Sn | Cu | 89 | 1 | 10 | Bi—1Sn—10Cu | 272 | >500 |
| 20 | Bi | Sn | Cu | 87 | 3 | 10 | Bi—3Sn—10Cu | 270 | >500 |
| 21 | Bi | Sn | Cu | 85 | 5 | 10 | Bi—5Sn—10Cu | 270 | >500 |
| 22 | Bi | Sn | Cu | 84 | 6 | 10 | Bi—6Sn—10Cu | 270 | >500 |
| 23 | Bi | In | Cu | 96 | 1 | 3 | Bi—1In—3Cu | 267 | >500 |
| 24 | Bi | In | Cu | 95.5 | 1.5 | 3 | Bi—1.5In—3Cu | 267 | >500 |
| 25 | Bi | In | Cu | 95 | 2 | 3 | Bi—2In—3Cu | 267 | >500 |
| 26 | Bi | In | Cu | 94 | 1 | 5 | Bi—1In—5Cu | 267 | >500 |
| 27 | Bi | In | Cu | 93 | 2 | 5 | Bi—2In—5Cu | 267 | >500 |
| 28 | Bi | In | Cu | 92 | 3 | 5 | Bi—3In—5Cu | 267 | >500 |
| 29 | Bi | In | Cu | 92 | 1 | 7 | Bi—1In—7Cu | 267 | >500 |
| 30 | Bi | In | Cu | 91 | 2 | 7 | Bi—2In—7Cu | 267 | >500 |
| 31 | Bi | In | Cu | 90 | 3 | 7 | Bi—3In—7Cu | 267 | >500 |
| 32 | Bi | In | Cu | 89 | 4 | 7 | Bi—4In—7Cu | 267 | >500 |
| 33 | Bi | In | Cu | 88 | 5 | 7 | Bi—5In—7Cu | 267 | >500 |
| 34 | Bi | In | Cu | 89 | 1 | 10 | Bi—1In—10Cu | 267 | >500 |
| 35 | Bi | In | Cu | 87 | 3 | 10 | Bi—3In—10Cu | 267 | >500 |
| 36 | Bi | In | Cu | 85 | 5 | 10 | Bi—5In—10Cu | 267 | >500 |
| 37 | Bi | In | Cu | 84 | 6 | 10 | Bi—6In—10Cu | 267 | >500 |
| 38 | Bi | In | Ag | 94 | 1 | 5 | Bi—1In—5Ag | 257 | 373 |
| 39 | Bi | In | Ag | 92 | 1 | 7 | Bi—1In—7Ag | 263 | 405 |
| 40 | Bi | In | Ag | 91 | 2 | 7 | Bi—2In—7Ag | 257 | 415 |
| 41 | Bi | In | Ag | 89 | 1 | 10 | Bi—1In—10Ag | 262 | 435 |
| 42 | Bi | In | Ag | 87 | 3 | 10 | Bi—3In—10Ag | 257 | 458 |
| 43 | Bi—2.5Ag | Sn | Cu | 94 | 1 | 5 | Bi—1Sn—5Cu | 263 | >500 |
| 44 | Bi—2.5Ag | Sn | Cu | 93 | 2 | 5 | Bi—2Sn—5Cu—2.3Ag | 263 | >500 |
| 45 | Bi—2.5Ag | Sn | Cu | 92 | 3 | 5 | Bi—3Sn—5Cu—2.3Ag | 263 | >500 |
| 46 | Bi—2.5Ag | In | Cu | 94 | 1 | 5 | Bi—1In—5Cu—2.4Ag | 263 | >500 |
| 47 | Bi—2.5Ag | In | Cu | 93 | 2 | 5 | Bi—2In—5Cu—2.3Ag | 263 | >500 |
| 48 | Bi—2.5Ag | In | Cu | 92 | 3 | 5 | Bi—3In—5Cu—2.3Ag | 263 | >500 |
| 49 | Bi—0.15Cu | In | Ag | 94 | 1 | 5 | Bi—1In—5Ag—0.1Cu | 263 | 375 |
| 50 | Bi—0.15Cu | Sn | Ag | 94 | 1 | 5 | Bi—1Sn—5Ag—0.1Cu | 257 | 352 |
| 51 | Bi | Sn | Ag—50Cu | 94 | 1 | 5 | Bi—1Sn—2.5Ag—2.5Cu | 263 | >500 |
| 52 | Bi | Sn | Ag—50Cu | 93 | 2 | 5 | Bi—2Sn—2.5Ag—2.5Cu | 261 | >500 |
| 53 | Bi | Sn | Ag—28Cu | 94 | 1 | 5 | Bi—1Sn—3.6Ag—1.4Cu | 263 | 475 |
| 54 | Bi | Sn | Ag—28Cu | 93 | 2 | 5 | Bi—2Sn—3.6Ag—1.4Cu | 257 | 491 |
| 55 | Bi | In | Ag—50Cu | 94 | 1 | 5 | Bi—1In—2.5Ag—0.5Cu | 263 | >500 |
| 56 | Bi | In | Ag—50Cu | 93 | 2 | 5 | Bi—2In—2.5Ag—0.5Cu | 263 | >500 |
| 57 | Bi | In | Ag—28Cu | 94 | 1 | 5 | Bi—1In—3.6Ag—1.4Cu | 263 | 452 |
| 58 | Bi | In | Ag—28Cu | 93 | 2 | 5 | Bi—2In—3.6Ag—1.4Cu | 257 | 445 |
| 59 | Bi | Sn—58Bi | Cu | 88 | 7 | 5 | Bi—2.94Sn—5Cu | 270 | >500 |
| 60 | Bi | In—51Bi | Cu | 89 | 6 | 5 | Bi—2.52Sn—5Cu | 267 | >500 |
| 61 | Sn—95Bi | | Cu | 90 | | 10 | Bi—4.5Sn—10Cu | 270 | >500 |
| 62 | In—95Bi | | Cu | 90 | | 10 | Bi—4.5In—10Cu | 270 | >500 |
| 63 | Bi | Sn | Ag—coated Cu | 92 | 3 | 5 | Bi—3Sn—0.8Ag—4.2Cu | 268 | >500 |
| 64 | Bi | Sn | Au—coated Cu | 92 | 3 | 5 | Bi—3Sn—0.4Au—4.6Cu | 268 | >500 |
| 65 | Bi | Sn | Sn—coated Cu | 92 | 3 | 5 | Bi—3.9Sn—4.1Cu | 267 | >500 |

TABLE 3-2

| No. | | First metal powder | Second metal powder | Third metal powder | First metal powder | Second metal powder | Third metal powder | Composition of soldered joint | Solidus Temp. (° C.) | Liquidus Temp. (° C.) |
|---|---|---|---|---|---|---|---|---|---|---|
| Comparative | 1 | Bi | Sn | Ag | 99.2 | 0.3 | 0.5 | Bi—0.3Sn—0.5Ag | 257 | 268 |
| | 2 | Bi | Sn | Ag | 98.5 | 0.5 | 1 | Bi—0.5Sn—1Ag | 256 | 265 |
| | 3 | Bi | Sn | Ag | 98.4 | 0.6 | 1 | Bi—0.6Sn—1Ag | 255 | 264 |
| | 4 | Bi | Sn | Cu | 99.2 | 0.3 | 0.5 | Bi—0.3Sn—0.5Cu | 270 | 374 |
| | 5 | Bi | Sn | Cu | 99 | 0.5 | 0.5 | Bi—0.5Sn—0.5Cu | 265 | 390 |
| | 6 | Bi | Sn | Cu | 98.5 | 0.5 | 1 | Bi—0.5Sn—1Cu | 270 | 438 |
| | 7 | Bi | In | Cu | 99.2 | 0.3 | 0.5 | Bi—0.3In—0.5Cu | 140 | 362 |
| | 8 | Bi | In | Cu | 99 | 0.5 | 0.5 | Bi—0.5In—0.5Cu | 109 | 360 |
| | 9 | Bi | In | Cu | 98.5 | 0.5 | 1 | Bi—0.5In—1Cu | 267 | 430 |
| | 10 | Bi | In | Ag | 99.2 | 0.3 | 0.5 | Bi—0.3In—0.5Ag | 187 | 268 |
| | 11 | Bi | In | Ag | 99 | 0.5 | 0.5 | Bi—0.5In—0.5Ag | 109 | 267 |
| | 12 | Bi | In | Ag | 98.5 | 0.5 | 1 | Bi—0.5In—1Ag | 201 | 268 |
| | 13 | Bi | Sn | Ag | 84 | 1 | 15 | Bi—1Sn—15Ag | 262 | 432 |
| | 14 | Bi | Sn | Ag | 83 | 2 | 15 | Bi—2Sn—15Ag | 262 | 445 |
| | 15 | Bi | Sn | Ag | 82 | 3 | 15 | Bi—3Sn—15Ag | 260 | 453 |
| | 16 | Bi | Sn | Ag | 81 | 4 | 15 | Bi—4Sn—15Ag | 257 | 460 |
| | 17 | Bi | Sn | Ag | 80 | 5 | 15 | Bi—5Sn—15Ag | 247 | 465 |
| | 18 | Bi | Sn | Ag | 79 | 6 | 15 | Bi—6Sn—15Ag | 220 | 469 |
| | 19 | Bi | Sn | Cu | 84 | 1 | 15 | Bi—1Sn—15Cu | 272 | >500 |
| | 20 | Bi | Sn | Cu | 82 | 3 | 15 | Bi—3Sn—15Cu | 272 | >500 |
| | 21 | Bi | Sn | Cu | 80 | 5 | 15 | Bi—5Sn—15Cu | 272 | >500 |
| | 22 | Bi | Sn | Cu | 78 | 7 | 15 | Bi—7Sn—15Cu | 272 | >500 |
| | 23 | Bi | Sn | Cu | 77 | 8 | 15 | Bi—8Sn—15Cu | 272 | >500 |
| | 24 | Bi | Sn | Cu | 75 | 10 | 15 | Bi—10Sn—15Cu | 222 | >500 |
| | 25 | Bi | In | Cu | 84 | 1 | 15 | Bi—1In—15Cu | 267 | >500 |
| | 26 | Bi | In | Cu | 82 | 3 | 15 | Bi—3In—15Cu | 267 | >500 |
| | 27 | Bi | In | Cu | 80 | 5 | 15 | Bi—5In—15Cu | 267 | >500 |
| | 28 | Bi | In | Cu | 78 | 7 | 15 | Bi—7In—15Cu | 267 | >500 |
| | 29 | Bi | In | Cu | 77 | 8 | 15 | Bi—8In—15Cu | 267 | >500 |
| | 30 | Bi | In | Cu | 75 | 10 | 15 | Bi—10In—15Cu | 267 | >500 |
| | 31 | Bi | In | Ag | 84 | 1 | 15 | Bi—1In—15Ag | 262 | 455 |
| | 32 | Bi | In | Ag | 82 | 3 | 15 | Bi—3In—15Ag | 259 | 492 |
| | 33 | Bi | In | Ag | 80 | 5 | 15 | Bi—5In—15Ag | 240 | >500 |
| | 34 | Bi | In | Ag | 78 | 7 | 15 | Bi—7In—15Ag | 202 | >500 |
| | 35 | Bi | In | Ag | 77 | 8 | 15 | Bi—8In—15Ag | 109 | >500 |
| | 36 | Bi | In | Ag | 75 | 10 | 15 | Bi—10In—15Ag | 109 | >500 |
| | 37 | — | Sn | Cu | 0 | 70 | 30 | Sn—30Cu | — | — |
| | 38 | Bi | — | — | 100 | — | — | Bi (No resin added) | 270 | 275 |
| | 39 | Bi | — | — | 100 | — | — | Bi (Resin added) | 270 | 275 |
| | 40 | Bi | Sn | — | 70 | 30 | — | Sn—70Bi (Resin added) | 138 | 210 |
| | 41 | Bi—1Sn—5Ag | — | — | 100 | 0 | 0 | Bi—1Sn—5Ag | 262 | 355 |
| | 42 | Bi—1.5Sn—5Ag | — | — | 100 | 0 | 0 | Bi—1.5Sn—5Ag | 257 | 360 |
| | 43 | Bi—1Sn—7Ag | — | — | 100 | 0 | 0 | Bi—1Sn—7Ag | 263 | 387 |
| | 44 | Bi—2Sn—7Ag | — | — | 100 | 0 | 0 | Bi—2Sn—7Ag | 257 | 395 |
| | 45 | Bi—1Sn—10Ag | — | — | 100 | 0 | 0 | Bi—1Sn—10Ag | 263 | 410 |
| | 46 | Bi—2Sn—10Ag | — | — | 100 | 0 | 0 | Bi—2Sn—10Ag | 260 | 420 |
| | 47 | Bi—3Sn—10Ag | — | — | 100 | 0 | 0 | Bi—3Sn—10Ag | 257 | 428 |
| | 48 | Bi—1Sn—1Cu | — | — | 100 | 0 | 0 | Bi—1Sn—1Cu | 260 | 455 |
| | 49 | Bi—1Sn—3Cu | — | — | 100 | 0 | 0 | Bi—1Sn—3Cu | 270 | 490 |
| | 50 | Bi—1.5Sn—3Cu | — | — | 100 | 0 | 0 | Bi—1.5Sn—3Cu | 270 | >500 |
| | 51 | Bi—2Sn—3Cu | — | — | 100 | 0 | 0 | Bi—2Sn—3Cu | 265 | >500 |
| | 52 | Bi—1Sn—5Cu | — | — | 100 | 0 | 0 | Bi—1Sn—5Cu | 272 | >500 |
| | 53 | Bi—2Sn—5Cu | — | — | 100 | 0 | 0 | Bi—2Sn—5Cu | 272 | >500 |
| | 54 | Bi—3Sn—5Cu | — | — | 100 | 0 | 0 | Bi—3Sn—5Cu | 270 | >500 |
| | 55 | Bi—1Sn—7Cu | — | — | 100 | 0 | 0 | Bi—1Sn—7Cu | 272 | >500 |
| | 56 | Bi—2Sn—7Cu | — | — | 100 | 0 | 0 | Bi—2Sn—7Cu | 272 | >500 |
| | 57 | Bi—3Sn—7Cu | — | — | 100 | 0 | 0 | Bi—3Sn—7Cu | 270 | >500 |
| | 58 | Bi—4Sn—7Cu | — | — | 100 | 0 | 0 | Bi—4Sn—7Cu | 270 | >500 |
| | 59 | Bi—1Sn—10Cu | — | — | 100 | 0 | 0 | Bi—1Sn—10Cu | 272 | >500 |
| | 60 | Bi—3Sn—10Cu | — | — | 100 | 0 | 0 | Bi—3Sn—10Cu | 270 | >500 |
| | 61 | Bi—5Sn—10Cu | — | — | 100 | 0 | 0 | Bi—5Sn—10Cu | 270 | >500 |
| | 62 | Bi—6Sn—10Cu | — | — | 100 | 0 | 0 | Bi—6Sn—10Cu | 270 | >500 |
| | 63 | Bi—1In—3Cu | — | — | 100 | 0 | 0 | Bi—1In—3Cu | 267 | >500 |
| | 64 | Bi—1.5In—3Cu | — | — | 100 | 0 | 0 | Bi—1.5In—3Cu | 267 | >500 |
| | 65 | Bi—2In—3Cu | — | — | 100 | 0 | 0 | Bi—2In—3Cu | 267 | >500 |
| | 66 | Bi—1In—5Cu | — | — | 100 | 0 | 0 | Bi—1In—5Cu | 267 | >500 |
| | 67 | Bi—2In—5Cu | — | — | 100 | 0 | 0 | Bi—2In—5Cu | 267 | >500 |

TABLE 3-3

| | No. | First metal powder | Second metal powder | Third metal powder | First metal powder | Second metal powder | Third metal powder | Composition of soldered joint | Solidus Temp. (° C.) | Liquidus Temp. (° C.) |
|---|---|---|---|---|---|---|---|---|---|---|
| Comparative | 68 | Bi—3In—5Cu | — | — | 100 | 0 | 0 | Bi—3In—5Cu | 267 | >500 |
| | 69 | Bi—1In—7Cu | — | — | 100 | 0 | 0 | Bi—1In—7Cu | 267 | >500 |
| | 70 | Bi—2In—7Cu | — | — | 100 | 0 | 0 | Bi—2In—7Cu | 267 | >500 |
| | 71 | Bi—3In—7Cu | — | — | 100 | 0 | 0 | Bi—3In—7Cu | 267 | >500 |
| | 72 | Bi—4In—7Cu | — | — | 100 | 0 | 0 | Bi—4In—7Cu | 267 | >500 |
| | 73 | Bi—5In—7Cu | — | — | 100 | 0 | 0 | Bi—5In—7Cu | 267 | >500 |
| | 74 | Bi—1In—10Cu | — | — | 100 | 0 | 0 | Bi—1In—10Cu | 267 | >500 |
| | 75 | Bi—3In—10Cu | — | — | 100 | 0 | 0 | Bi—3In—10Cu | 267 | >500 |
| | 76 | Bi—5In—10Cu | — | — | 100 | 0 | 0 | Bi—5In—10Cu | 267 | >500 |
| | 77 | Bi—6In—10Cu | — | — | 100 | 0 | 0 | Bi—6In—10Cu | 267 | >500 |
| | 78 | Bi—1In—5Ag | — | — | 100 | 0 | 0 | Bi—1In—5Ag | 257 | 373 |
| | 79 | Bi—1In—7Ag | — | — | 100 | 0 | 0 | Bi—1In—7Ag | 263 | 405 |
| | 80 | Bi—2In—7Ag | — | — | 100 | 0 | 0 | Bi—2In—7Ag | 257 | 415 |
| | 81 | Bi—1In—10Ag | — | — | 100 | 0 | 0 | Bi—1In—10Ag | 262 | 435 |
| | 82 | Bi—3In—10Ag | — | — | 100 | 0 | 0 | Bi—3In—10Ag | 257 | 458 |
| | 83 | Bi—1Sn—5Cu | — | — | 100 | 0 | 0 | Bi—1Sn—5Cu | 263 | >500 |
| | 84 | Bi—2Sn—5Cu—2.3Ag | — | — | 100 | 0 | 0 | Bi—2Sn—5Cu—2.3Ag | 263 | >500 |
| | 85 | Bi—3Sn—5Cu—2.3Ag | — | — | 100 | 0 | 0 | Bi—3Sn—5Cu—2.3Ag | 263 | >500 |
| | 86 | Bi—1In—5Cu—2.4Ag | — | — | 100 | 0 | 0 | Bi—1In—5Cu—2.4Ag | 263 | >500 |
| | 87 | Bi—2In—5Cu—2.3Ag | — | — | 100 | 0 | 0 | Bi—2In—5Cu—2.3Ag | 263 | >500 |
| | 88 | Bi—3In—5Cu—2.3Ag | — | — | 100 | 0 | 0 | Bi—3In—5Cu—2.3Ag | 263 | >500 |
| | 89 | Bi—1In—5Ag—0.1Cu | — | — | 100 | 0 | 0 | Bi—1In—5Ag—0.1Cu | 263 | 375 |
| | 90 | Bi—1Sn—5Ag—0.1Cu | — | — | 100 | 0 | 0 | Bi—1Sn—5Ag—0.1Cu | 257 | 352 |
| | 91 | Bi—1Sn—2.5Ag—2.5Cu | — | — | 100 | 0 | 0 | Bi—1Sn—2.5Ag—2.5Cu | 263 | >500 |
| | 92 | Bi—2Sn—2.5Ag—2.5Cu | — | — | 100 | 0 | 0 | Bi—2Sn—2.5Ag—2.5Cu | 261 | >500 |
| | 93 | Bi—1Sn—3.6Ag—1.4Cu | — | — | 100 | 0 | 0 | Bi—1Sn—3.6Ag—1.4Cu | 263 | 475 |
| | 94 | Bi—2Sn—3.6Ag—1.4Cu | — | — | 100 | 0 | 0 | Bi—2Sn—3.6Ag—1.4Cu | 257 | 491 |
| | 95 | Bi—1In—2.5Ag—0.5Cu | — | — | 100 | 0 | 0 | Bi—1In—2.5Ag—0.5Cu | 263 | >500 |
| | 96 | Bi—2In—2.5Ag—0.5Cu | — | — | 100 | 0 | 0 | Bi—2In—2.5Ag—0.5Cu | 263 | >500 |
| | 97 | Bi—1In—3.6Ag—1.4Cu | — | — | 100 | 0 | 0 | Bi—1In—3.6Ag—1.4Cu | 263 | 452 |
| | 98 | Bi—2In—3.6Ag—1.4Cu | — | — | 100 | 0 | 0 | Bi—2In—3.6Ag—1.4Cu | 257 | 445 |

TABLE 3-4

| | No. | First metal powder | Second metal powder | Third metal powder | First metal powder | Second metal powder | Third metal powder | N3/N1 | N2/N1 | 5 μm ≤ | Equation (1) 0.1 < N3/N1 < 1.5 | | Equation (2) 0.1 < N2/N1 |
|---|---|---|---|---|---|---|---|---|---|---|---|---|---|
| Present Invention | 14 | Bi (30 μm) | Sn (20 μm) | Cu (15 μm) | 92 | 3 | 5 | 0.54 | 0.16 | ○ | ○ | ○ | ○ |
| | 66 | Bi (30 μm) | Sn (20 μm) | Cu (25 μm) | 92 | 3 | 5 | 0.12 | 0.16 | ○ | ○ | ○ | ○ |
| | 67 | Bi (30 μm) | Sn (20 μm) | Cu (11 μm) | 92 | 3 | 5 | 1.38 | 0.16 | ○ | ○ | ○ | ○ |
| | 68 | Bi (30 μm) | Sn (22 μm) | Cu (15 μm) | 92 | 3 | 5 | 0.54 | 0.12 | ○ | ○ | ○ | ○ |
| | 69 | Bi (30 μm) | Sn (20 μm) | Cu (1.5 μm) | 92 | 3 | 5 | 543.48 | 0.16 | X | ○ | X | ○ |
| | 70 | Bi (30 μm) | Sn (20 μm) | Cu (5 μm) | 92 | 3 | 5 | 14.67 | 0.16 | ○ | ○ | X | ○ |
| | 71 | Bi (30 μm) | Sn (20 μm) | Cu (10 μm) | 92 | 3 | 5 | 1.83 | 0.16 | ○ | ○ | X | ○ |
| | 72 | Bi (30 μm) | Sn (20 μm) | Cu (40 μm) | 92 | 3 | 5 | 0.03 | 0.16 | ○ | X | ○ | ○ |
| | 73 | Bi (30 μm) | Sn (20 μm) | Cu (30 μm) | 92 | 3 | 5 | 0.07 | 0.16 | ○ | X | ○ | ○ |
| | 74 | Bi (25 μm) | Sn (20 μm) | Cu (15 μm) | 92 | 3 | 5 | 0.31 | 0.09 | ○ | ○ | ○ | X |

※N1: Number of particles of the first metal powder
N2: Number of particles of the second metal powder
N3: Number of particles of the third metal powder
※○: Satisfied
X: Unsatisfied

TABLE 4-1

| | No. | Powder First metal powder | Powder Second metal powder | Powder Third metal powder | Powder composition (%) First metal powder | Powder composition (%) Second metal powder | Powder composition (%) Third metal powder | Composition of soldered joint | Properties Flowing out of solder Defects (%) | Properties Flowing out of solder Results | Properties Amount of remaining low-melting point component Amount (mJ/mg) | Properties Amount of remaining low-melting point component Results |
|---|---|---|---|---|---|---|---|---|---|---|---|---|
| Present Invention | 4 | Bi | Sn | Ag | 91 | 2 | 7 | Bi—2Sn—7Ag | 0 | ◎ | 0 | ◎ |
| | 11 | Bi | Sn | Cu | 95 | 2 | 3 | Bi—2Sn—3Cu | 0 | ◎ | 0 | ◎ |
| | 14 | Bi | Sn | Cu | 92 | 3 | 5 | Bi—3Sn—5Cu | 0 | ◎ | 0 | ◎ |
| | 22 | Bi | Sn | Cu | 84 | 6 | 10 | Bi—6Sn—10Cu | 0 | ◎ | 0 | ◎ |
| | 25 | Bi | In | Cu | 95 | 2 | 3 | Bi—2In—3Cu | 0 | ◎ | 0 | ◎ |
| | 28 | Bi | In | Cu | 92 | 3 | 5 | Bi—3In—5Cu | 0 | ◎ | 0 | ◎ |
| | 37 | Bi | In | Cu | 84 | 6 | 10 | Bi—6In—10Cu | 0 | ◎ | 0 | ◎ |
| | 40 | Bi | In | Ag | 91 | 2 | 7 | Bi—2In—7Ag | 0 | ◎ | 0 | ◎ |
| | 44 | Bi—2.5Ag | Sn | Cu | 93 | 2 | 5 | Bi—2Sn—5Cu—2.3Ag | 0 | ◎ | 0 | ◎ |
| | 47 | Bi—2.5Ag | In | Cu | 93 | 2 | 5 | Bi—2In—5Cu—2.3Ag | 0 | ◎ | 0 | ◎ |
| | 50 | Bi—0.15Cu | Sn | Ag | 94 | 1 | 5 | Bi—1Sn—5Ag—0.1Cu | 0 | ◎ | 0 | ◎ |
| | 54 | Bi | Sn | Ag—28Cu | 93 | 2 | 5 | Bi—2Sn—3.6Ag—1.4Cu | 0 | ◎ | 0 | ◎ |
| | 59 | Bi | Sn—58Bi | Cu | 88 | 7 | 5 | Bi—2.94Sn—5Cu | 0 | ◎ | 0 | ◎ |
| | 60 | Bi | In—51Bi | Cu | 89 | 6 | 5 | Bi—2.52Sn—5Cu | 0 | ◎ | 0 | ◎ |
| | 61 | | Sn—95Bi | Cu | 90 | | 10 | Bi—4.5Sn—10Cu | 0 | ◎ | 0 | ◎ |
| | 62 | | In—95Bi | Cu | 90 | | 10 | Bi—4.5Sn—10Cu | 0 | ◎ | 0 | ◎ |
| | 63 | Bi | Sn | Ag-coated Cu | 92 | 3 | 5 | Bi—3Sn—0.8Ag—4.2Cu | 0 | ◎ | 0 | ◎ |
| Comparative | 1 | Bi | Sn | Ag | 99.2 | 0.3 | 0.5 | Bi—0.3Sn—0.5Ag | 0 | ◎ | 0 | ◎ |
| | 4 | Bi | Sn | Cu | 99.2 | 0.3 | 0.5 | Bi—0.3Sn—0.5Cu | 0 | ◎ | 0 | ◎ |
| | 9 | Bi | In | Cu | 98.5 | 0.5 | 1 | Bi—0.5In—1Cu | 0 | ◎ | 0 | ◎ |
| | 12 | Bi | In | Ag | 98.5 | 0.5 | 1 | Bi—0.5In—1Ag | 0 | ◎ | 1.1 | X |
| | 15 | Bi | Sn | Ag | 82 | 3 | 15 | Bi—3Sn—15Ag | 0 | ◎ | 0 | ◎ |
| | 20 | Bi | Sn | Cu | 82 | 3 | 15 | Bi—3Sn—15Cu | 0 | ◎ | 0 | ◎ |
| | 26 | Bi | In | Cu | 82 | 3 | 15 | Bi—3In—15Cu | 0 | ◎ | 0 | ◎ |
| | 32 | Bi | In | Ag | 82 | 3 | 15 | Bi—3In—15Ag | 0 | ◎ | 0 | ◎ |
| | 37 | — | Sn | Cu | 0 | 70 | 30 | Sn—30Cu | 85 | X | 32.1 | X |
| | 38 | Bi | — | — | 100 | 0 | 0 | Bi(No resin added) | 0 | ◎ | 0 | ◎ |
| | 39 | Bi | — | — | 100 | 0 | 0 | Bi(Resin added) | 0 | ◎ | 0 | ◎ |
| | 40 | Bi | — | Sn | 70 | 30 | 0 | Sn—70Bi (Resin added) | 0 | ◎ | 16.4 | X |
| | 44 | Bi—2Sn—7Ag | — | — | 100 | 0 | 0 | Bi—2Sn—7Ag | 0 | ◎ | 0 | ◎ |

| | No. | Properties Heat resistance (Heat load test) Time (s) | Properties Heat resistance (Heat load test) Results | Bonding strength Room temp. Strength (N/mm²) | Bonding strength Room temp. Result | Bonding strength ≤260° C. Strength (N/mm²) | Bonding strength ≤260° C. Results | Solder Balls Occurrence (%) | Solder Balls Result | Voids Occurrence (%) | Voids Results | Self-alignment Ratio (%) | Self-alignment Results | Solderability Covering area (%) | Solderability Results |
|---|---|---|---|---|---|---|---|---|---|---|---|---|---|---|---|
| Present Invention | 4 | 300up | ◎ | 8.0 | ◎ | 7.1 | ◎ | 0 | ◎ | 0 | ◎ | 95 | ◎ | 72 | ◎ |
| | 11 | 300up | ◎ | 8.5 | ◎ | 7.5 | ◎ | 0 | ◎ | 0 | ◎ | 95 | ◎ | 72 | ◎ |
| | 14 | 300up | ◎ | 8.0 | ◎ | 7.2 | ◎ | 0 | ◎ | 0 | ◎ | 90 | ◎ | 73 | ◎ |
| | 22 | 300up | ◎ | 7.0 | ◎ | 5.9 | ◎ | 0 | ◎ | 0 | ◎ | 95 | ◎ | 76 | ◎ |
| | 25 | 300up | ◎ | 8.5 | ◎ | 6.9 | ◎ | 0 | ◎ | 0 | ◎ | 85 | ◎ | 77 | ◎ |
| | 28 | 300up | ◎ | 7.7 | ◎ | 7 | ◎ | 0 | ◎ | 0 | ◎ | 95 | ◎ | 72 | ◎ |
| | 37 | 300up | ◎ | 7.0 | ◎ | 5.9 | ◎ | 0 | ◎ | 0 | ◎ | 95 | ◎ | 73 | ◎ |
| | 40 | 300up | ◎ | 6.9 | ◎ | 6.1 | ◎ | 0 | ◎ | 0 | ◎ | 85 | ◎ | 74 | ◎ |
| | 44 | 300up | ◎ | 8.0 | ◎ | 7.3 | ◎ | 0 | ◎ | 0 | ◎ | 95 | ◎ | 72 | ◎ |
| | 47 | 300up | ◎ | 8.2 | ◎ | 6.9 | ◎ | 0 | ◎ | 0 | ◎ | 90 | ◎ | 72 | ◎ |
| | 50 | 300up | ◎ | 8.0 | ◎ | 7.1 | ◎ | 0 | ◎ | 0 | ◎ | 85 | ◎ | 72 | ◎ |
| | 54 | 300up | ◎ | 7.9 | ◎ | 7 | ◎ | 0 | ◎ | 0 | ◎ | 95 | ◎ | 73 | ◎ |
| | 59 | 300up | ◎ | 7.4 | ◎ | 6.5 | ◎ | 0 | ◎ | 0 | ◎ | 90 | ◎ | 73 | ◎ |
| | 60 | 300up | ◎ | 7.8 | ◎ | 7 | ◎ | 0 | ◎ | 0 | ◎ | 95 | ◎ | 72 | ◎ |
| | 61 | 300up | ◎ | 6.9 | ◎ | 5.5 | ◎ | 0 | ◎ | 0 | ◎ | 90 | ◎ | 75 | ◎ |
| | 62 | 300up | ◎ | 6.8 | ◎ | 5.9 | ◎ | 0 | ◎ | 0 | ◎ | 90 | ◎ | 75 | ◎ |
| | 63 | 300up | ◎ | 8.4 | ◎ | 7.3 | ◎ | 0 | ◎ | 0 | ◎ | 90 | ◎ | 73 | ◎ |
| Comparative | 1 | 300up | ◎ | 8.9 | ◎ | 7.1 | ◎ | 0 | ◎ | 25 | X | 95 | ◎ | 48 | X |
| | 4 | 300up | ◎ | 8.8 | ◎ | 7.7 | ◎ | 0 | ◎ | 16 | X | 95 | ◎ | 52 | X |
| | 9 | 300up | ◎ | 8.4 | ◎ | 7.3 | ◎ | 0 | ◎ | 25 | X | 85 | ◎ | 52 | X |
| | 12 | 105 | X | 8.4 | ◎ | 0.2 | X | 0 | ◎ | 17 | X | 95 | ◎ | 53 | X |
| | 15 | 300up | ◎ | 6.8 | ◎ | 6.2 | ◎ | 0 | ◎ | 13 | X | 45 | X | 52 | X |
| | 20 | 300up | ◎ | 6.5 | ◎ | 6.2 | ◎ | 0 | ◎ | 18 | X | 60 | X | 66 | X |
| | 26 | 300up | ◎ | 6.9 | ◎ | 6.2 | ◎ | 0 | ◎ | 16 | X | 55 | X | 65 | X |

TABLE 4-1-continued

| | | | | | | | | | | | | | | |
|---|---|---|---|---|---|---|---|---|---|---|---|---|---|---|
| 32 | 300up | ◎ | 6.2 | ◎ | 5.8 | ◎ | 0 | ◎ | 15 | X | 50 | X | 68 | X |
| 37 | 300up | ◎ | 9.1 | ◎ | 2 | ○ | 0 | ◎ | 0 | ◎ | 0 | X | 75 | ◎ |
| 38 | 300up | ◎ | 2.9 | ○ | 2.9 | ○ | 0 | ◎ | 15 | X | 75 | ○ | 43 | X |
| 39 | 300up | ◎ | 11.1 | ◎ | 9.2 | ◎ | 83 | X | 0 | ◎ | 75 | ○ | 42 | X |
| 40 | 300up | ◎ | 10.9 | ◎ | 8.2 | ◎ | 78 | X | 0 | ◎ | 100 | ◎ | 75 | ◎ |
| 44 | 300up | ◎ | 2.1 | ○ | 1.6 | ○ | 0 | ◎ | 22 | X | 0 | X | 49 | X |

TABLE 4-2

| | | Powder | | | Powder composition (%) | | | Composition of soldered joint | Properties | | | |
|---|---|---|---|---|---|---|---|---|---|---|---|---|
| | | | | | | | | | Flowing out of solder | | Amount of remaining low-melting point component | |
| | No. | First metal Powder | Second metal powder | Third metal powder | First metal powder | Second metal powder | Third metal powder | | Defects (%) | Results | Amount (mJ/mg) | Results |
| Present Invention | 14 | Bi (30 μm) | Sn (20 μm) | Cu (15 μm) | 92 | 3 | 5 | Bi—3Sn—5Cu | 0 | ◎ | 0 | ◎ |
| | 66 | Bi (30 μm) | Sn (20 μm) | Cu (25 μm) | 92 | 3 | 5 | Bi—3Sn—5Cu | 0 | ◎ | 0 | ◎ |
| | 67 | Bi (30 μm) | Sn (20 μm) | Cu (11 μm) | 92 | 3 | 5 | Bi—3Sn—5Cu | 0 | ◎ | 0 | ◎ |
| | 68 | Bi (30 μm) | Sn (22 μm) | Cu (15 μm) | 92 | 3 | 5 | Bi—3Sn—5Cu | 0 | ◎ | 0 | ◎ |
| | 69 | Bi (30 μm) | Sn (20 μm) | Cu (1.5 μm) | 92 | 3 | 5 | Bi—3Sn—5Cu | 0 | ◎ | 0 | ◎ |
| | 70 | Bi (30 μm) | Sn (20 μm) | Cu (5 μm) | 92 | 3 | 5 | Bi—3Sn—5Cu | 0 | ◎ | 0.3 | ○ |
| | 71 | Bi (30 μm) | Sn (20 μm) | Cu (10 μm) | 92 | 3 | 5 | Bi—3Sn—5Cu | 0 | ◎ | 0.4 | ○ |
| | 72 | Bi (30 μm) | Sn (20 μm) | Cu (40 μm) | 92 | 3 | 5 | Bi—3Sn—5Cu | 0 | ◎ | 0.8 | ○ |
| | 73 | Bi (30 μm) | Sn (20 μm) | Cu (30 μm) | 92 | 3 | 5 | Bi—3Sn—5Cu | 0 | ◎ | 0 | ◎ |
| | 74 | Bi (25 μm) | Sn (20 μm) | Cu (15 μm) | 92 | 3 | 5 | Bi—3Sn—5Cu | 0 | ◎ | 0 | ◎ |

| | No. | Heat resistance (Heat load test) Time (s) | Results | Bonding strength Room temp. Strength (N/mm²) | Results | ≤260° C. Strength (N/mm²) | Results | Solder Balls Occurrence (%) | Results | Voids Occurrence (%) | Results | Self-alignment Ratio (%) | Results |
|---|---|---|---|---|---|---|---|---|---|---|---|---|---|
| Present Invention | 14 | 300up | ◎ | 8.0 | ◎ | 7.2 | ◎ | 0 | ◎ | 0 | ◎ | 90 | ◎ |
| | 66 | 300up | ◎ | 8.2 | ◎ | 7.9 | ◎ | 0 | ◎ | 0 | ◎ | 85 | ◎ |
| | 67 | 300up | ◎ | 7.4 | ◎ | 7.0 | ◎ | 0 | ◎ | 0 | ◎ | 90 | ◎ |
| | 68 | 300up | ◎ | 7.8 | ◎ | 7.0 | ◎ | 0 | ◎ | 0 | ◎ | 85 | ◎ |
| | 69 | 300up | ◎ | 7.5 | ◎ | 5.9 | ◎ | 0 | ◎ | 10 | ○ | 70 | ○ |
| | 70 | 300up | ◎ | 4.5 | ◎ | 2.4 | ○ | 0 | ◎ | 6 | ○ | 70 | ○ |
| | 71 | 300up | ◎ | 6.1 | ◎ | 2.2 | ○ | 0 | ◎ | 2 | ○ | 75 | ○ |
| | 72 | 300up | ◎ | 8.2 | ◎ | 1.2 | ○ | 0 | ◎ | 9 | ○ | 70 | ○ |
| | 73 | 300up | ◎ | 7.7 | ◎ | 1.5 | ○ | 0 | ◎ | 2 | ○ | 75 | ○ |
| | 74 | 300up | ◎ | 7.6 | ◎ | 2.1 | ○ | 0 | ◎ | 3 | ○ | 75 | ○ |

It is apparent from the results shown in Table 4-1 and Table 4-2 that Comparative Examples 1, 4, 9, and 12 in which the content of the second metal in the solder alloy was less than 0.7% had a high rate of occurrence of voids and less aggregation since the proportion of the second metal which melted was small. This is because when the content of the second metal was less than 0.7%, wettability with respect to the first metal was inadequate.

Comparative Examples 15, 20, 26, and 32 in which the content of the third metal in the solder alloy was over 10% exhibited a high rate of occurrence of voids, resulting in a degraded self-alignment property. This is because the presence of a large amount of the third metal in a solid state prevented (decreased) flowability of molten metal.

Since the temperature at which heat resistance is required for the present invention is 255° C., Comparative Example 12 was not acceptable because its solidus temperature after bonding was lower than 255° C. This is because the solder of Comparative Example 12 contained a large amount of low-melting point components, and these were melted at a temperature of 260° C. or less. The resulting joint did not exhibit heat resistance at 260° C.

Comparative Example 37 indicates the case in which the second and third metals were combined and used as a mixture of powder in solder paste and the first metal was not added. Since the amount of Sn in this solder paste was larger than in the other solder pastes, during the reheating test, a remaining low-melting point component was melted to cause solder stains. Due to the presence of Cu, the heat resistance was evaluated as good, but the bonding strength at 260° C. was rather low.

Comparative Examples 38, 39, 40 and 44 employed solder paste which contained Bi-alloys or Sn—Bi alloys. The Bi-alloy solder paste of Comparative Example 38 resulted in a high degree of occurrence of voids. The solder paste of Comparative Example 39 further contained resin in addition to that of Comparative Example 38 in order to improve strength. The occurrence of solder balls was experienced. Comparative Example 40 employed a solder paste containing an Sn—Bi based solder alloy. The occurrence of solder balls was observed. The amount of the low-melting point component which melted at a temperature of 260° C. or less increased. Comparative Example 44 shows the case in which all the first, second, and third metals were pre-alloyed. In this Comparative Example the heat resistance was inadequate and the self-alignment effect was degraded. The wettability is marked "X" (bad).

In contrast, since Examples 4-63 employed a solder paste in which the second metal in an amount of 0.7-6% and the third metal in an amount of 1.3-10% were added to the first metal, and due to the effectiveness of the second metal at improving melt properties to reduce the solidus temperature of the first metal, it was possible to carry out soldering at a low temperature, e.g., 280° C. Wettability with respect to an electrode was also improved. In addition, the second metal had good wettability with respect to the first metal, so the occurrence of voids was successfully prevented. A good self-alignment effect was also obtained, and there was no occurrence of solder balls.

In Examples 4-63, the resulting solder joints had solidus temperatures of 255° C. or higher, and a remaining component with a low melting point which melted at a temperature 260° C. or lower almost disappeared due to the formation of an intermetallic compound between the second and third metals. Thus, there was no occurrence of stains of solder, and the heat-resistance was improved.

It was confirmed that the same effects were obtained when the first metal was an alloy, e.g., Bi-2.5Ag or Bi-0.15Cu (see Examples 44, 47, and 50), or the third metal was an alloy, e.g., Ag—Cu (see Example 54), or a coating of Au, Ag, or Sn was provided on the surface of the third metal (see Example 63), or the second metal was an alloy, e.g., Sn-58Bi, In-51Bi (see Examples 59 and 60). In addition, when the first and second metals were pre-alloyed to form Sn—Bi or Sn—In (see Examples 61 and 62), it was also confirmed that the same effects were obtained with respect to the spreadability of molten solder and self-alignment of the solder.

It was also confirmed that the solder pastes of Examples 1-74 which are not shown in Table 4-1 and Table 4-2 had the same effectiveness as in the above. It is noted, however, that since Examples 69-74 did not satisfy equations (1) and (2) which indicate the ratio of the number of particles of each of the metals, the occurrence of voids and the self-alignment effect were degraded to some extent compared with Examples 14, 66, 67, and 68 of Table 4-2, which satisfied the equations.

The invention claimed is:

1. A solder paste comprising a metal powder component mixed with a flux component, wherein:
   the metal powder component consists of Bi powder, a powder selected from Sn, In, Sn—In alloys, Bi—In alloys, and Bi—Sn alloys, and a powder selected from Cu, Ag, Sb, Ni, Fe, Co, Pd, Pt, Ti, Cu—Ag alloys, and Cu—Sb alloys in a coated or uncoated state,
   the metal powder component has an overall composition consisting of at least 84 mass % of Bi, a total of 0.7-6 mass % of at least one of Sn and In, and a total of 1.3-10 mass % of at least one of Cu, Ag, Sb, Ni, Fe, Co, Pd, Pt, and Ti,
   an alloy having a composition which is the same as the overall composition of the metal powder component has a solidus temperature of at least 255° C., and
   when the solder paste is applied with a thickness of 150 μm to Cu lands of a printed circuit board and the solder paste and the printed circuit board undergo reflow soldering with a peak temperature of 280° C. to form solder layers on the Cu lands, more than 70% of the area of the lands is covered by the solder layers.

2. A solder paste as claimed in claim 1 wherein the metal powder component consists of Bi powder, Sn powder, and Ag powder.

3. A solder paste as claimed in claim 1 wherein the metal powder component consists of Bi powder, Sn powder, and Cu powder.

4. A solder paste as claimed in claim 1 wherein the metal powder component consists of Bi powder, In powder, and Cu powder.

5. A solder paste as claimed in claim 1 wherein the metal powder component consists of Bi powder, In powder, and Ag powder.

6. A solder paste as claimed in claim 1 wherein the metal powder component consists of Bi powder, Sn powder, and an Ag—Cu alloy powder.

7. A solder paste as claimed in claim 1 wherein the metal powder component consists of Bi powder, a Bi—Sn alloy powder, and Cu powder.

8. A solder paste as claimed in claim 1 wherein the metal powder component consists of Bi powder, a Bi—In alloy powder, and Cu powder.

9. A solder paste as claimed in claim 1 wherein the powder selected from Sn, In, Sn—In alloys, Bi—In alloys, and Bi—Sn alloys is a powder of a Bi—Sn alloy.

10. A solder paste as claimed in claim 1 wherein the powder selected from Sn, In, Sn—In alloys, Bi—In alloys, and Bi—Sn alloys is a powder of a Bi—In alloy.

11. A solder paste comprising a metal powder component mixed with a flux component, wherein:
   the metal powder component contains at least two different types of metal powders having different compositions from each other,
   the metal powder component consists of at least 84 mass % of a first metal, 0.7-6 mass % of a second metal different from the first metal, and 1.3-10 mass % of a third metal different from the first and second metals,
   the first metal consists of at least one material selected from Bi and Bi alloys having a solidus temperature of at least 255° C.,
   the second metal consists of at least one material selected from elements and alloys which can lower the solidus temperature of the first metal, and
   the third metal consists of a core of at least one material selected from elements and alloys which can form an intermetallic compound with the second metal and a coating of Ag, Au, or Sn with a thickness of 0.02-2 μm formed on the core, and at least a portion of the third metal is not alloyed with the first metal or the second metal.

12. A solder paste comprising a metal powder component mixed with a flux component, wherein:
   the metal powder component consists of three different types of metal powders in elemental form,
   the metal powder component has an overall composition consisting of at least 84 mass % of Bi, 0.7-6 mass % of one of Sn and In, and 1.3-10 mass % of one of Cu, Ag, Sb, Ni, Fe, Co, Pd, Pt, and Ti,
   an alloy having a composition which is the same as the overall composition of the metal powder component has a solidus temperature of at least 255° C., and when the solder paste is applied with a thickness of 150 μm to Cu lands of a printed circuit board and the solder paste and the printed circuit board undergo reflow soldering with a peak temperature of 280° C. to form solder layers on the Cu lands, more than 70% of the area of the lands is covered by the solder layers.

* * * * *